(12) United States Patent
Kobayashi

(10) Patent No.: US 6,906,458 B2
(45) Date of Patent: Jun. 14, 2005

(54) METHOD FOR MANUFACTURING ORGANIC EL DEVICE, ORGANIC EL DEVICE AND ELECTRONIC APPARATUS

(75) Inventor: Hidekazu Kobayashi, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 202 days.

(21) Appl. No.: 09/925,320

(22) Filed: Aug. 10, 2001

(65) Prior Publication Data

US 2002/0057051 A1 May 16, 2002

(30) Foreign Application Priority Data

Aug. 11, 2000 (JP) .......................................... 2000-244591
Aug. 10, 2001 (JP) .......................................... 2001-244851

(51) Int. Cl.$^7$ ............................................... H05B 33/00
(52) U.S. Cl. ........................ 313/506; 313/504; 313/509
(58) Field of Search ................................. 313/504–506, 313/509; 315/169.3; 427/66; 445/24

(56) References Cited

U.S. PATENT DOCUMENTS

| | | | | |
|---|---|---|---|---|
| 4,356,429 A | * | 10/1982 | Tang ........................... | 313/503 |
| 6,075,316 A | * | 6/2000 | Shi et al. ..................... | 313/504 |
| 6,194,119 B1 | * | 2/2001 | Wolk et al. .................. | 430/200 |
| 6,246,179 B1 | * | 6/2001 | Yamada ..................... | 315/169.3 |
| 6,274,979 B1 | * | 8/2001 | Celii et al. ................... | 313/506 |
| 6,281,634 B1 | * | 8/2001 | Yokoyama ................ | 315/169.3 |
| 6,361,886 B2 | * | 3/2002 | Shi et al. ..................... | 428/690 |
| 6,366,016 B1 | * | 4/2002 | Sakaguchi et al. .......... | 313/506 |
| 6,403,237 B1 | * | 6/2002 | Noguchi et al. ............. | 428/690 |
| 6,633,122 B2 | * | 10/2003 | Kijima et al. ................ | 313/506 |

2004/0046495 A1 * 3/2004 Peng ........................... 313/504

FOREIGN PATENT DOCUMENTS

WO    WO 96/33516    * 10/1996    ........... H01L/33/00

OTHER PUBLICATIONS

Appl. Phys. Lett. vol. 51, No. 12, Sep. 21, 1987, American Institute of Physics, "Organic electroluminescent diodes", C. W. Tang et al., pp. 913–915.

Appl. Phys. Lett. vol. 71, No. 1, Jul. 7, 1997, American Institute of Physics, "Operating stability of light–emitting polymer diodes based on poly (p–phenylene vinylene", J. C. Carter et al., pp. 34–36.

* cited by examiner

*Primary Examiner*—Vip Patel
*Assistant Examiner*—Glenn Zimmerman
(74) *Attorney, Agent, or Firm*—Oliff & Berridge, PLC (57) ABSTRACT

The present invention provides reduced production cost in a method for manufacturing an organic EL device including a step of forming a light-emitting layer having a predetermined pattern ink-jet method. The method achieves this objective by not forming a bank which surrounds an area in a substrate surface other than an area at which a light-emitting layer is formed. A solution-repellent treatment is performed so that a droplet of a liquid containing a light-emitting material has a contact angle of 15° to 90° with respect to the substrate surface immediately before formation of the light-emitting layer. Accordingly, a fluorine containing layer (a layer composed of a material containing fluorine) is formed. Between a step of forming the light-emitting layer and a step of forming a cathode, a step of forming a hole blocking layer over the entire surface of the substrate is performed.

13 Claims, 7 Drawing Sheets

METHOD FOR MANUFACTURING ORGANIC EL DEVICE, ORGANIC EL DEVICE AND ELECTRONIC APPARATUS

BACKGROUND OF THE INVENTION

1. Field of Invention

The present invention relates to methods for manufacturing organic EL (electroluminescence) devices. The organic EL devices can be used, for example, as displays of a television and a computer, and light sources, such as a backlight of a liquid crystal display.

2. Description of Related Art

Recently, as a self-luminous display used in place of a liquid crystal display, organic EL devices (light-emitting devices having a structure in which an organic light-emitting layer is provided between an anode and a cathode) have rapidly been developed. As a material for the light-emitting layer used for an organic EL device, there are organic materials with low molecular weight such as an aluminum quinolinol complex (Alq3), and organic materials with large molecular weight such as polyparaphenylene vinylene (PPV). A light-emitting layer composed of an organic material with low molecular weight can be formed by a deposition method as disclosed in, for example, Appl. Phys. Lett. 51(12), 21 Sep. 1987, p. 913. A light-emitting layer composed of an organic material with large molecular weight is formed by a coating method as disclosed in, for example, Appl. Phys. Lett. 71(1), 7 Jul. 1997, p. 34.

For example, in an organic EL device for use in a display, it can be necessary to arrange a light-emitting layer at a position on a substrate corresponding to each pixel. In addition, in the cases of a color display and a white light source, it can be necessary to arrange each of light-emitting layers having three primary colors at each corresponding position on a substrate. Accordingly, when the arrangement of light-emitting layers can be performed by an ink-jet method, coating and patterning can be simultaneously performed, and hence, patterning with high accuracy can be performed in a short period of time. In addition, since a material used in this method can be minimized, the material can be efficiently used, and reduction in production cost can be effectively achieved.

Previously, when light-emitting layers are formed into a predetermined pattern by an inkjet method, banks composed of an insulating layer can be formed, and the light-emitting layers are formed in areas surrounded thereby. Whether or not anodes are patterned corresponding to the light-emitting area, the formation of the insulating layers as described above can be performed.

SUMMARY OF THE INVENTION

The present invention provides a method for manufacturing an organic EL device in which at least a first electrode layer, a light-emitting layer, and a second electrode layer are sequentially formed above a substrate, and the light-emitting layer can be formed by supplying a liquid containing a light-emitting material in a light-emitting area above the substrate surface. The method for manufacturing the organic EL device includes forming no bank which surrounds an area above the substrate surface other than an area at which the light-emitting layer is formed, performing a solution-repellent treatment so that a droplet of the liquid has a contact angle in the range of 15° to 90° with respect to the substrate surface immediately before the formation of the light-emitting layer, and supplying the liquid to a predetermined position above the substrate surface to which the solution-repellent treatment is applied.

The present invention provides an organic EL device that can include a plurality of light-emitting areas above a substrate, each having a light-emitting layer provided between a first electrode layer and a second electrode layer opposing thereto, and a hole blocking layer, which allows electrons but not holes to pass therethrough, in the light-emitting areas and therebetween.

In addition, the present invention provides a method for manufacturing an organic EL device that can include a plurality of light-emitting areas above a substrate. The method for manufacturing the organic EL device can include a step of forming first electrode layers by patterning in areas above the substrate at which the light-emitting areas are to be formed, a step of forming a hole injection/transport layer above the first electrode layers and between the first electrode layers, a step of forming a light-emitting layer above the hole injection/transport layer in the areas at which the light-emitting areas are to be formed, a step of forming a hole blocking layer, which allows electrons but not holes to pass therethrough, in the light-emitting areas and therebetween including areas above the light-emitting layers, and a step of forming a second electrode layer above the hole blocking layer.

In addition, the present invention provides an electronic apparatus provided with an organic EL device. The organic EL device mentioned above includes a plurality of light-emitting areas above a substrate, each having a light-emitting layer provided between a first electrode layer and a second electrode layer opposing thereto, and in the light-emitting areas and therebetween, a hole injection/transport layer and a hole blocking layer which allows electrons but not holes to pass therethrough.

BRIEF DESCRIPTION OF THE DRAWINGS

The invention will be described with reference to the accompanying drawings, in which like elements are referenced to with like numerals, and in which.

DETAILED DESCRIPTION OF PREFERRED EMBODIMENTS

In the conventional techniques described above, when the light-emitting layers each having a predetermined pattern are formed by an ink jet method, it is prerequisite to form bank composed of an insulating layer. When the bank is formed, a photolithographic step and an etching step must be performed, and hence, there has been a problem in that the production cost is increased.

The present invention is made in consideration of the problems of the conventional techniques, and a feature of the present invention is to provide a method for manufacturing an organic EL device in which formation of the bank composed of an insulating layer is not necessary even in the case that an ink-jet method is used for forming light-emitting layers each having a predetermined pattern.

In a first method for manufacturing an organic EL device according to an embodiment of the present invention, at least a first electrode layer, a light-emitting layer, and a second electrode layer are sequentially formed above a substrate, and the light-emitting layer is formed by supplying a liquid containing a light-emitting material to a light-emitting area above a substrate surface. The method including not forming a bank which surrounds an area above the substrate surface other than the light-emitting area, performing a solution-repellent treatment so that a droplet of the liquid has a contact angle of 15° to 90° with respect to the substrate surface immediately before formation of the light-emitting layer, and supplying the liquid to a predetermined position above the substrate surface to which the solution-repellent treatment is applied.

In the method described above, by performing the solution-repellent treatment so that the droplet of the liquid has the contact angle of 15° to 90° with respect to the substrate surface immediately before the formation of the light-emitting layer, when the light-emitting layer is formed by an ink-jet method without the bank, the liquid can be held at the predetermined position.

The first method for manufacturing the organic EL device is preferably used when the formation of the light-emitting layer is performed in a plurality of light-emitting areas above the substrate surface by an ink-jet method. The light-emitting area means an area at which the light-emitting layer exists between the first electrode layer and the second electrode layer opposing thereto. For example, in a display unit, each pixel is the light-emitting area.

In this method for manufacturing the organic EL device, as the solution-repellent treatment, a fluorination treatment for providing fluorine atoms above the substrate surface is preferably performed. As this fluorination treatment, there may be mentioned (1) a plasma treatment using a fluorocarbon gas ($CF_4$ gas, for example), (2) a method for applying a fluorinated alkyl coupling agent (for example, perfluoroalkyl trimethoxy silane and "LP-8T" manufactured by Shin-Etsu Silicone Co., Ltd., as an example of a commercially available product), and (3) a method for exposing the substrate to a vapor of a fluorinated alkyl coupling agent (perfluoroalkyl trimethoxy silane or the like). In addition, when a layer (for example, hole injection/transport layer) under the light-emitting layer is formed by application of a liquid material, the solution-repellent treatment may also be performed by mixing a fluorinated alkyl coupling agent with the liquid material.

In the method for manufacturing the organic EL device having the first feature described above, a treatment for injecting oxygen radicals (oxygen plasma treatment or UV irradiation) into the substrate surface is preferably performed immediately before the solution-repellent treatment. As a result, adhesion of the solution-repellent layer with respect to the substrate surface is improved.

In this method for manufacturing the organic EL device, the bank, which is provided in an area above the substrate surface other than that at which the light-emitting layer is formed so as to surround the light-emitting area, is not formed. Accordingly, by another method other than the formation of the bank, it is necessary to insulate two electrodes from each other located in the area other than the light-emitting areas. As a method therefor, there may be mentioned a method for forming a hole blocking layer, which allows electron but not holes to pass therethrough, in the light-emitting areas and therebetween above the substrate. Due to the presence of this hole blocking layer, the two electrodes are insulated from each other by the area between the light-emitting areas above the substrate.

As the hole blocking layer, a metal fluoride layer composed of an alkali fluoride or an alkaline earth fluoride (such as lithium fluoride, sodium fluoride, cesium fluoride, magnesium fluoride, calcium fluoride, strontium fluoride, or the like) may be mentioned. In addition, an insulating thin-film having a thickness of several nanometers may also be used.

In addition, an electron blocking layer, which allows holes but not electrons to pass therethrough, is preferably further formed in the light-emitting areas and therebetween above the substrate surface.

In this method for manufacturing the organic EL device, the first electrode layer is an anode, the second electrode layer is a cathode, and the solution-repellent treatment may be performed above the light-emitting areas and therebetween above the substrate immediately before the formation of the light-emitting layer.

In this method for manufacturing the organic EL device, the first electrode layer is an anode, the second electrode layer is a cathode, and the hole blocking layer, which allows electrons but not holes to pass therethrough, may be formed in the light-emitting areas and therebetween above the substrate after the formation of the light-emitting layer.

In this method for manufacturing the organic EL device, in the case that the hole injection/transport layer is formed between the anode and the light-emitting layer, a fluorination treatment is performed above the hole injection/transport layer after the hole injection/transport layer is formed above the anode.

In many cases, the hole transport layer is provided between the light-emitting layer and the anode of the organic EL device. Holes are injected into this hole transport layer from the anode, and the hole transport layer transports these holes to the light-emitting layer. When the light-emitting layer has hole transporting characteristics, the hole transport layer may not be provided in some cases. In addition, the hole injection layer and the hole transport layer may be respectively provided in some cases. Accordingly, in the present invention, a hole injection layer and/or a hole transport layer formed between a light-emitting layer and an anode are called a "hole injection/transport layer".

An organic EL device according to an embodiment of the present invention can include a plurality of light-emitting areas above a substrate, each having a light-emitting layer provided between a first electrode layer and a second electrode layer opposing thereto, and a hole blocking layer, which allows electrons but not holes to pass therethrough, provided in the light-emitting areas and therebetween. An example of this organic EL device may be an organic EL device in which a layer composed of a material containing fluorine is provided between the first electrode layer and the light-emitting layer.

Another example of this organic EL device may be an organic EL device in which the first electrode layer is an anode, the second electrode layer is a cathode, a hole injection/transport layer is provided above the anode, and a hole blocking layer composed of an alkali fluoride or an alkaline earth fluoride is provided.

In a method for manufacturing an organic EL device according to an embodiment of the present invention, the organic EL device can include a plurality of light-emitting areas above a substrate. The method for manufacturing the organic EL device can include forming first electrode layers by patterning above the substrate in areas at which the light-emitting areas are to be formed, forming a hole injection/transport layer above the first electrode layers and between the first electrode layers, forming light-emitting layers above the hole injection/transport layer in the areas at which the light-emitting areas are to be formed, forming a hole blocking layer, which allows electrons but not holes to pass therethrough, in the light-emitting areas and therebetween including areas above the light-emitting layers, and forming second electrode layers above the hole blocking layer.

In the method for manufacturing the organic EL device described in the above, it is preferable that an electron blocking layer, which allows holes but not electrons to pass therethrough, be further formed between the hole injection/transport layer and the light-emitting layer and in the light-emitting areas and therebetween.

In the method for manufacturing the organic EL device described in the above, the formation of the light-emitting layers may be performed by an ink-jet method or a deposition method.

Another example of this organic EL device may be an organic EL device in which the first electrode layer is an anode, the second electrode layer is a cathode, a hole injection/transport layer is provided above the anode, and a hole blocking layer composed of an alkali fluoride or an alkali earth fluoride is provided.

An electronic apparatus according to an embodiment of the present invention can include an organic EL device, wherein the organic EL device includes a plurality of light-emitting areas above a substrate, each having a light-emitting layer provided between a first electrode layer and a second electrode layer opposing thereto, and in the light-emitting areas and therebetween a hole injection/transport layer and a hole blocking layer which allows electrons but not holes to pass therethrough.

Hereinafter, embodiments of the present invention will be described with reference to the figures.

It is to be understood that the present invention is not limited to the embodiments described below.

Figure 1:
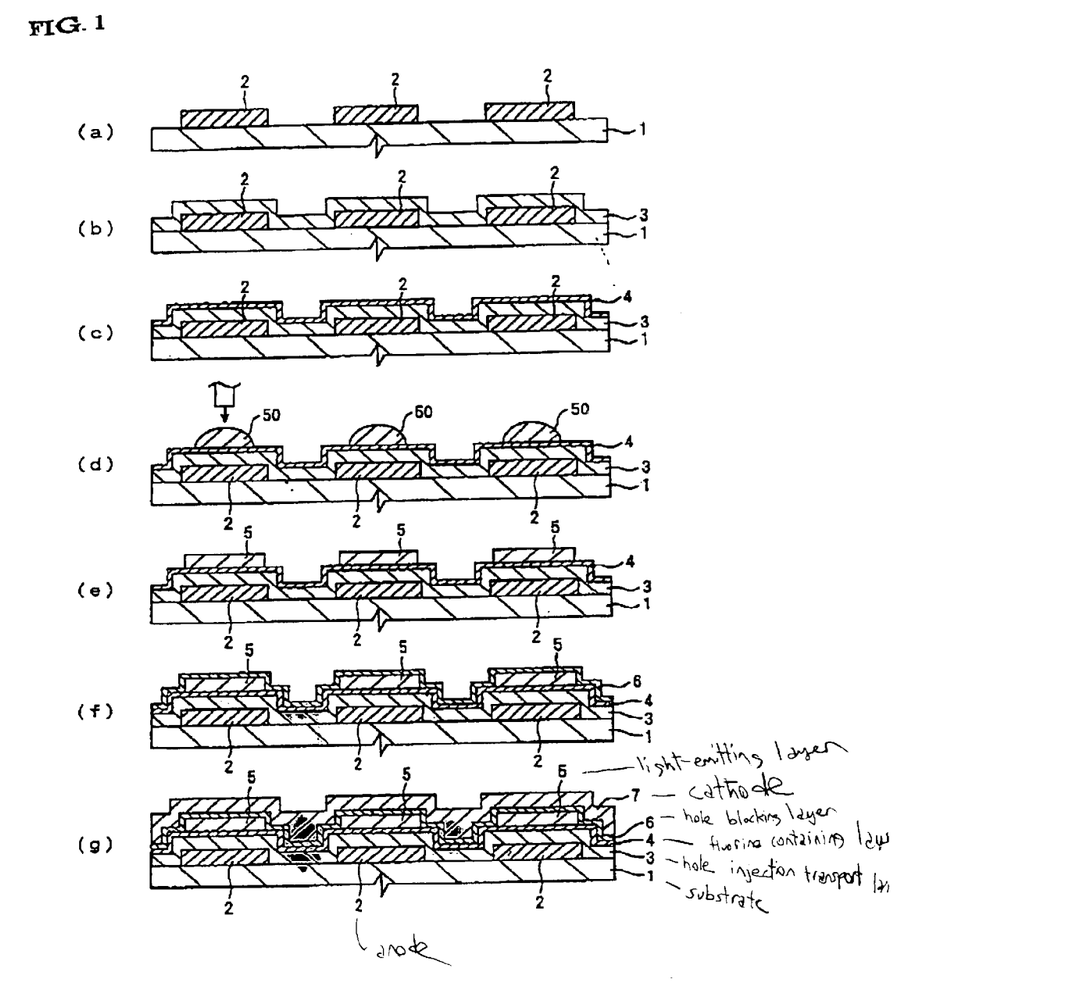
FIG. 1 illustrates manufacturing steps in a method for manufacturing an organic EL device according to a first embodiment of the present invention.

FIG. 1 illustrates exemplary manufacturing steps in a method for manufacturing an organic EL device according to a first embodiment of the present invention. In this method, first, an IDIXO ($In_2 O_3$—ZnO) thin-film is formed on a transparent glass substrate 1, and by performing photolithography and etching on this thin-film, transparent anodes (first electrode layers) 2 are formed at pixel positions (a plurality of positions) in a substrate surface. FIG. 1(a) shows this state. As a material for the transparent anode, ITO ($In_2 O_3$—$SnO_2$) may also be used.

Next, on the surface of anode 2, irradiation treatment using UV rays having a wavelength of 200 nm or less is performed. This treatment increases the work function of the anode 2. An oxygen plasma treatment may be performed instead. Subsequently, after applying "Baytron" manufactured by Bayer AG to the entire surface of the substrate 1 by spin-coating for forming a film, drying is performed, whereby a hole injection/transport layer 3 is formed. FIG. 1(b) shows this state. In this embodiment, although the hole injection/transport layer 3 is formed over the entire surface of the substrate, it may exist at least in light-emitting areas and therebetween, that is, hole injection/transport layers may not be connected to each other in the light-emitting areas and therebetween.

Next, a plasma treatment using a $CF_4$ gas (fluorocarbon gas) is performed over the entire surface (the substrate surface immediately before the formation of the light-emitting layer) of the hole injection/transport layer 3, whereby the surface of the hole injection/transport layer 3 is fluorinated (solution-repellent). The conditions of the plasma treatment are set such that the power is 300 W, the distance between the substrate plane and the electrode is 1 mm, the transport speed of the substrate is 10 mm/second, the carrier gas is helium, and the environmental pressure is an atmospheric pressure.

Accordingly, as shown in FIG. 1(c), a fluorine containing layer (a layer formed of a material containing fluorine) 4 is formed on the hole injection/transport layer 3. By the plasma treatment, fluorine atoms are bonded to molecules existing on the surface of a polymeric material which forms the hole injection/transport layer 3. The fluorine containing layer 4 indicates an area to which these fluorine atoms are bonded.

Next, a xylene solution containing poly(dioctyl fluorene) (a light-emitting material) at a concentration of 1 wt % is discharged using an ink-jet method at a position corresponding to each anode 2. Immediately before this discharge, since the fluorine containing layer 4 exists on the topmost surface of the substrate 1, and a contact angle of a droplet 50 of the solution is in the range of 15° to 90° with respect to the surface of this fluorine containing layer 4, the solution remains in a predetermined area corresponding to the area of the anode. FIG. 1(d) shows this state.

Next, by evaporating the solvent of the droplet 50, a light-emitting layer 5 is formed above each anode 2. FIG. 1(e) shows this state.

In this embodiment, the formation of the light-emitting layer is preformed by an inkjet method, however, it is to be understood that a printing method may also be used.

Next, a lithium fluoride thin-film (a hole blocking layer) 6 is formed by a vacuum deposition method over the entire surface of the glass substrate 1. FIG. 1(f) shows this state. In this embodiment, the lithium fluoride thin-film (hole blocking layer) 7 is formed over the entire surface of the substrate, however, it may exist at least in the light-emitting areas and therebetween, that is, lithium fluoride thin-films (hole blocking layers) may not be connected to each other in the light-emitting areas and therebetween.

Next, a lithium/aluminum laminated thin-film (cathode) 7 is formed (the lithium thin-film is formed at the lithium fluoride thin-film 6 side) over the entire surface of this lithium fluoride thin-film 6 by a vacuum deposition method. FIG. 1(g) shows this state. As the cathode, in addition to lithium, Ca, Mg, or an alloy containing such metal is preferably used. In addition, a film composed of a relatively stable metal, such as Al, Ag, or Au, may also be used on the cathode described above. As a film-forming method, in addition to a vacuum deposition method, a sputtering method may also be used.

Figure 2:
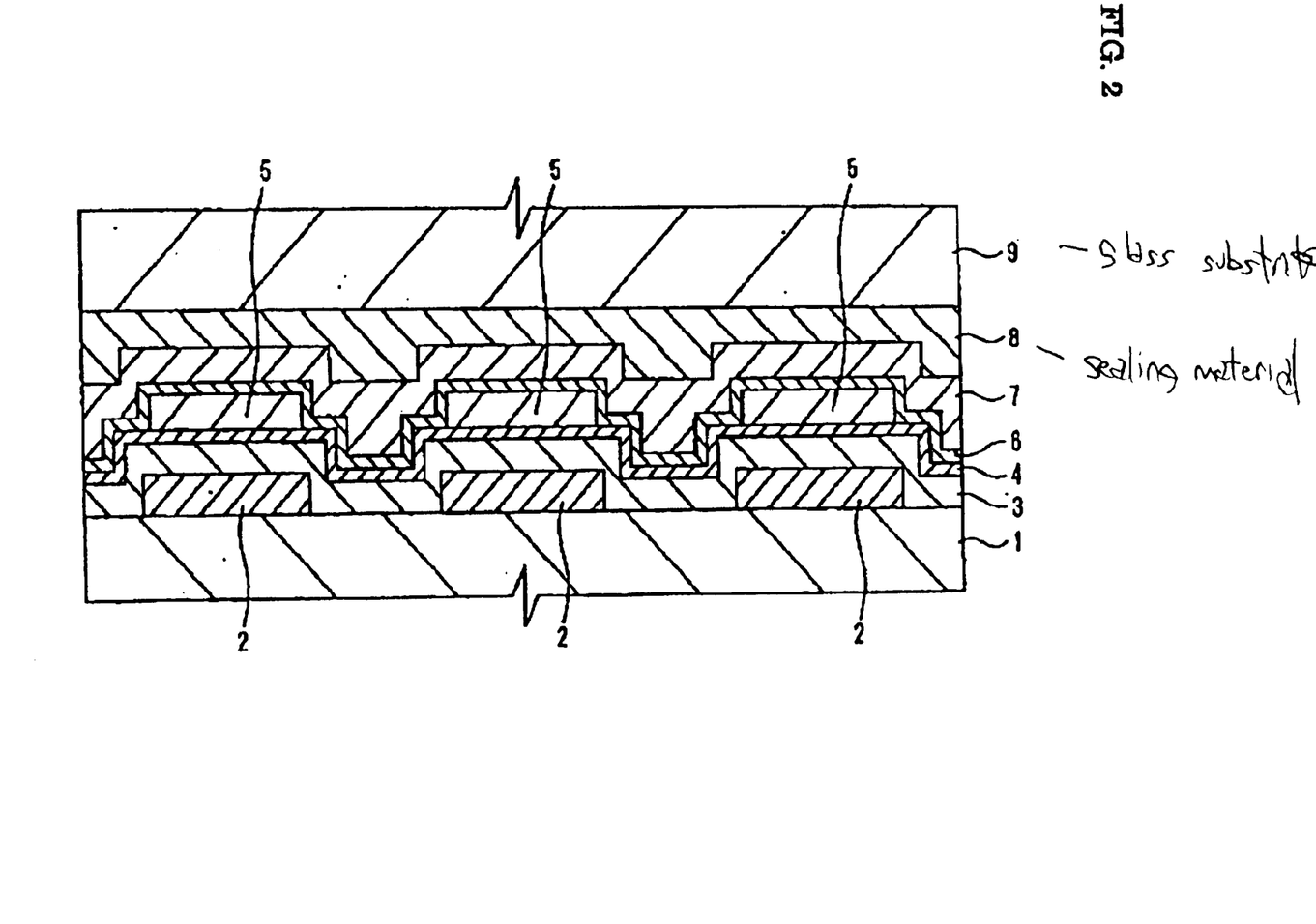
FIG. 2 is a cross-sectional view showing an organic EL device formed by the method according to the first embodiment and to a third embodiment.

Next, by sealing the upper surface of the cathode 7, as shown in FIG. 2, an organic EL panel (organic EL device) is obtained. In this embodiment, a sealing material 8 composed of an epoxy resin is provided over the entire surface of the cathode 7, and a glass substrate 9 for sealing is provided thereon. In addition, as a sealing method, can sealing using a metal or a glass may also be performed. In both sealing methods, as required, a desiccant or a deoxidizer may be enclosed in a sealed area. In addition, there is a method for forming a thin-film having superior gas barrier properties, such as aluminum nitride, silicon nitride, or silicon oxide, by deposition or sputtering.

By connecting a driving circuit to the organic EL device thus formed, an organic EL display unit can be obtained.

Figure 3:
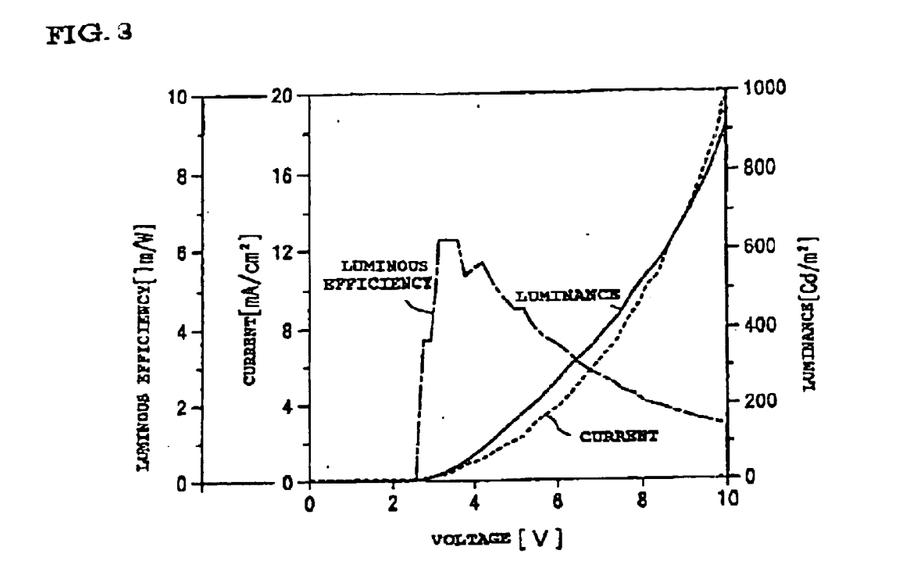
FIG. 3 is a graph showing the results obtained by measuring luminous characteristics and current characteristics at a position corresponding to a light-emitting layer of the organic EL device formed by the method according to the first embodiment.

When the luminous properties and current properties are measured at a position corresponding to the light-emitting layer 2 by applying a voltage to this organic EL panel, the graph shown in FIG. 3 is obtained. In addition, when the current properties are measured at a position (non light-emitting area) between the adjacent light-emitting layers 5, the curve a shown in FIG. 4 is obtained.

Figure 4:
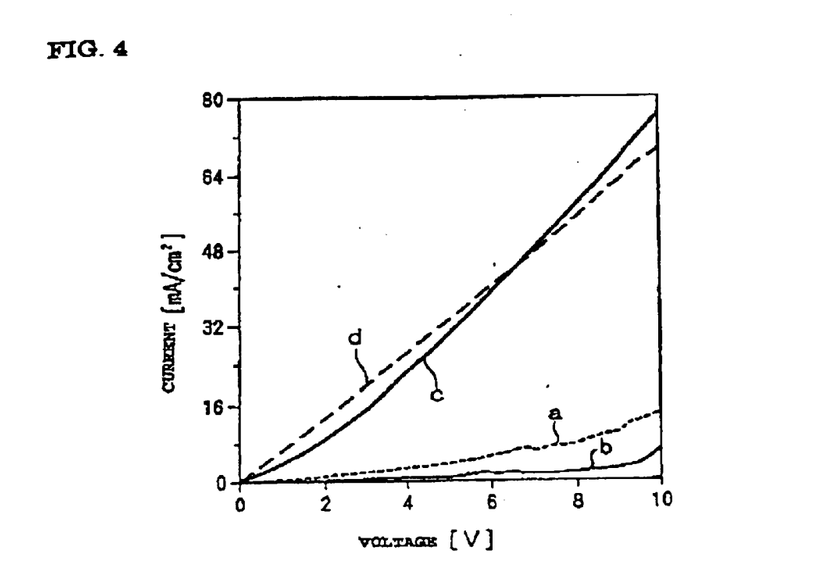
FIG. 4 is a graph showing the results obtained by measuring current properties at a position (non light-emitting area) between adjacent light-emitting layers of an organic EL device curve A shows the results of the organic EL device formed by the method according to the first embodiment, curve B shows the results of the device when a fluorine containing layer is not formed in the non light-emitting area, curve C shows the results when a lithium fluoride thin-film is not formed in the non light-emitting area, and curve D shows the results when both the fluorine containing layer and the lithium fluoride thin-film are not formed in the non light-emitting area.

The measurement results of the current properties are shown in FIG. 4 in which the curve b shows the results when the fluorine containing layer 4 is not formed in the non light-emitting area. The curve c shows the results when the lithium fluoride thin-film 6 is not formed in the non light-emitting area. The curve d shows the results when the fluorine containing layer 4 and the lithium fluoride thin-film 6 are not formed in the non light-emitting area.

As can be seen from these results, it is understood that a sufficient luminous properties can be obtained in the light-emitting area (light-emitting layer 5) according to the organic EL device of this embodiment. In addition, by forming both the fluorine containing layer 4 and the lithium fluoride thin-film 6 without providing banks, which are previously formed in the non light-emitting area, compared to the case (the curve d in FIG. 4) in which the both the layer and the film are not formed, it is understood that superior insulating properties can be obtained. That is, in the organic EL device of this embodiment, the light-emitting areas are separated from each other by the lithium fluoride thin-film (hole blocking layer) 6 and the fluorine containing layer (electron blocking layer) 4.

Concerning the insulating properties of the non light-emitting area, compared to the result (the curve a) according to this embodiment, superior insulating properties can be obtained in the case (the curve b) in which the lithium fluoride thin-film (hole blocking layer) 6 is formed in the non light-emitting area without providing the fluorine containing layer 4. In addition, the insulating properties obtained in the case (the curve c) in which the fluorine containing layer 4 is formed in the non light-emitting area without providing the lithium fluoride thin-film 6 are approximately equivalent to those obtained in the case (the curve d) in which the both are not formed.

Figure 5:
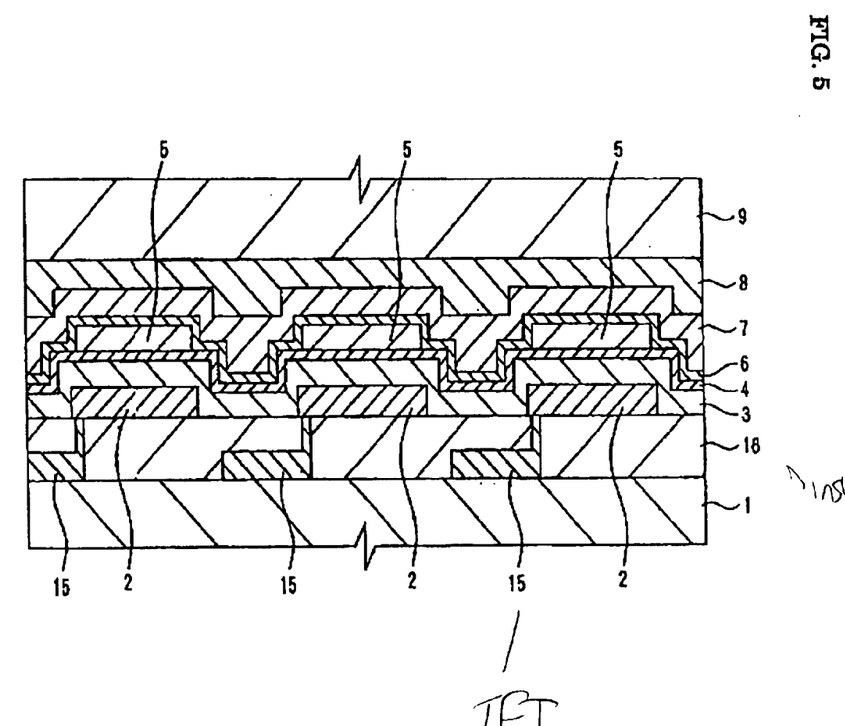
FIG. 5 is a cross-sectional view showing an organic EL device formed by a method according to a second embodiment.

FIG. 5 is a cross-sectional view showing an organic EL device according to a second embodiment of the present invention. In this embodiment, in a manner different from that in the first embodiment, a TFT (thin-film transistor) element 15 is formed at each pixel electrode (anode 2).

Accordingly, when this organic EL device is formed, before the step (step of forming the anode 2 on the glass substrate 1) shown in FIG. 1(a) of the first embodiment is performed, a step of forming the TFT element 15 at a predetermined position (position corresponding to an area between the adjacent pixels) of the substrate 1 corresponding to each pixel and a step of forming a contact hole for connecting the TFT element 15 to the anode 2 are performed. Reference numeral 16 indicates an insulating layer ($SiO_2$ film, for example) formed during the above-mentioned steps.

The organic EL device shown in FIG. 5 is formed by using the same method as that in the first embodiment except for the points described above. This organic EL device is an active matrix type organic EL display device. By using this device, when a predetermined driving signal is input into the TFT element for each pixel, a still image and a moving image can be displayed.

In a method for manufacturing an organic El device having a structure in which a hole injection layer or a hole transport layer and a light-emitting layer at a position corresponding to a light-emitting pixel (a light-emitting area) are laminated on an anode, and after a hole blocking layer is laminated on the front surface, a cathode and a sealing layer are laminated, an example using a mask deposition method will be described as means for laminating the light-emitting layer at a position corresponding to the light-emitting pixel. The cross-sectional view of the organic EL device of this embodiment is the same as that shown in FIG. 2.

After ITO is patterned as the anode 2, a UV irradiation treatment at a wavelength of 174 nm is performed, and m-MTDATA and TPD are deposited as a hole injection layer or a hole transport layer 3. In these steps, these layers may be formed by a mask deposition at a position corresponding to the light-emitting pixel through a physical mask. Next, mask deposition of Alq3, which is a material for the light-emitting layer 5, is performed at the position corresponding to the light-emitting pixel through a physical mask. As a hole blocking layer 6, lithium fluoride is deposited in an evacuated atmosphere. Next, as a cathode 7, calcium and aluminum are sequentially deposited.

Furthermore, sealing and mounting are performed, thereby forming an organic EL device. As the sealing method, in this embodiment, a sealing material 8 composed of an epoxy resin is provided over the entire surface of the cathode 7, and a glass substrate 9 for sealing is provided thereon; however, can sealing using a metal or a glass may be performed. In both sealing methods, as required, a desiccant or a deoxidizer may be enclosed in the sealed area. In addition, there is a method for forming a thin-film having superior gas barrier properties, such as aluminum nitride, silicon nitride, or silicon oxide, by deposition or sputtering.

Figure 6:
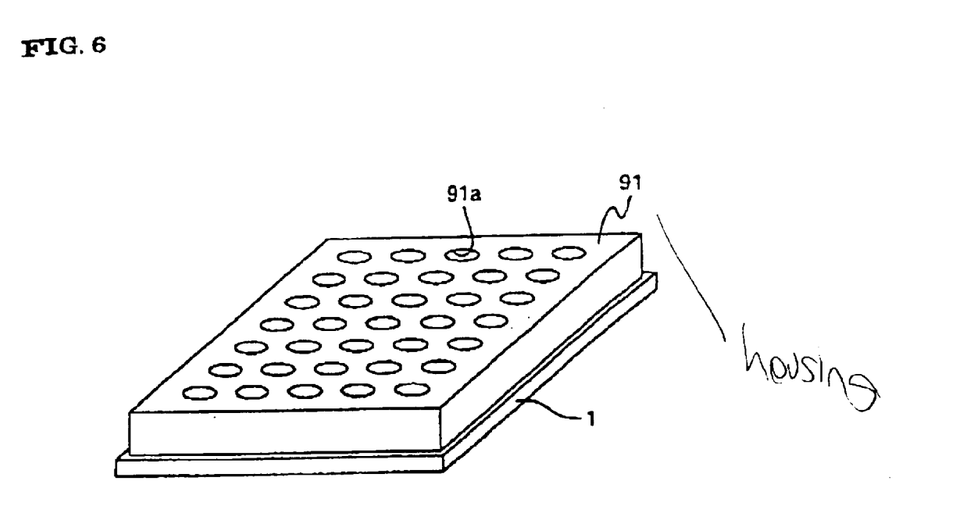
FIG. 6 is a perspective view showing an organic EL device formed by a method according to a fourth embodiment.

FIG. 6 is a perspective view showing an organic EL device according to a fourth embodiment of the present invention. This organic EL device is a white plane light source, and except for the two points described below, the cross-section perpendicular to a glass substrate 1 is approximately equivalent to that in the first embodiment shown in FIG. 2.

One difference is that instead of the glass substrate 9 for sealing in the first embodiment, a housing 91 is used having circular opening portions 91a which are regularly provided in the upper surface thereof. The other difference is that as a light-emitting layer 5, a red light-emitting material (R), a green light-emitting material (G), and a blue light-emitting material (B) are repeatedly and regularly formed.

In addition, the individual R, G, and B light-emitting layers 5 are formed at pitch of 70.5 $\mu$m to have each dot with 40 $\mu$m diameter. In this embodiment, in order to obtain white light when the light-emitting layers are driven by the same voltage, the diameter of each dot (circle forming the plan surface of the light-emitting layer) is formed so as to be equal to each other, and the ratio of the number of dots are R:G:B=2:1:4.

In the same manner as that in the first embodiment except for the points described above, a white plane light source shown in FIG. 6 is formed. When a voltage is applied to this white plane light source, white luminescence can be obtained.

In the embodiments described above, the light-emitting layer is formed by an inkjet method, but it may also be formed by a printing method such as a screen printing method.

In the method of the present invention, although a bank is not formed which surrounds an area in the substrate surface other than the area at which light-emitting layer is formed, a pattern composed of an insulating material and having an aperture portion in accordance with the pixel dimensions may be formed above the substrate surface before the light-emitting layer is formed, and a solution-repellent treatment defined in the present invention may be performed in the substrate surface after this pattern is formed. As a result, the dimensional accuracy of each pixel can be improved. In the case described above, since the light-emitting layer is formed in an area extending to the outside of the aperture portion, the pattern does not correspond to the bank mentioned above.

In addition, in the individual embodiments described above, since the transparent glass substrate 1 is used as the substrate, the transparent anode 2 is provided at the substrate side, and the cathode 7 is opaque, light generated in the light-emitting layer is reflected at the cathode 7 and is then emitted to the glass substrate 1 side. However, by forming an opaque electrode (first electrode) at the substrate side and a transparent second electrode, light generated in the light-emitting layer may be emitted to the side opposite to the substrate. The material used for the cathode may be, in addition to ITO, a metal material such as gold, silver, copper, or a metal having a low work function, i.e., calcium, magnesium, cesium, strontium, or rubidium, that is formed into a transparent thin-film. In addition, a thin-film alloy composed of magnesium and silver or composed of aluminum and lithium may also be used.

In the case described above, since the first electrode is opaque, the TFT element can be formed in the pixel position in the substrate surface, and hence, compared to the structure shown in FIG. 5 in which the TFT element must be formed at the position between the pixels, the ratio of the entire pixel area to the substrate area can be increased. In addition, since an opaque substrate can be used, a semiconductor substrate such as a silicon substrate can also be used.

Furthermore, in the individual embodiments described above, the electrode (first electrode) at the substrate side is used as an anode, and the electrode (second electrode) at the side opposite to the substrate is used as a cathode, but the first electrode may be used as a cathode, and the second electrode may be used as an anode. In the case described above, the positional relationship between the layers with respect to the substrate is opposite to that described in the first embodiment.

Furthermore, the organic EL device of the present invention may be applied to various electronic apparatuses, such as a mobile personal computer, a mobile phone, a digital still camera and the like.

Figure 7:
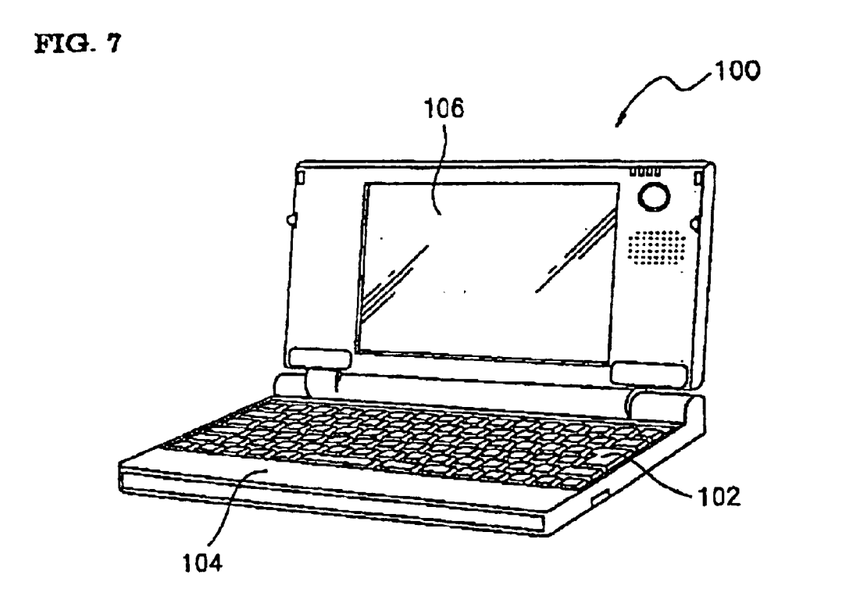
FIG. 7 is a perspective view showing the structure of a personal computer corresponding to an example of an electronic apparatus to which the organic EL device of the present invention is applied.

FIG. 7 is a perspective view showing the structure of a mobile personal computer. In FIG. 7, a personal computer 100 has a structure composed of a main body 104 provided with a keyboard 102 and a display unit 106 formed of the organic EL device of the present invention.

Figure 8:
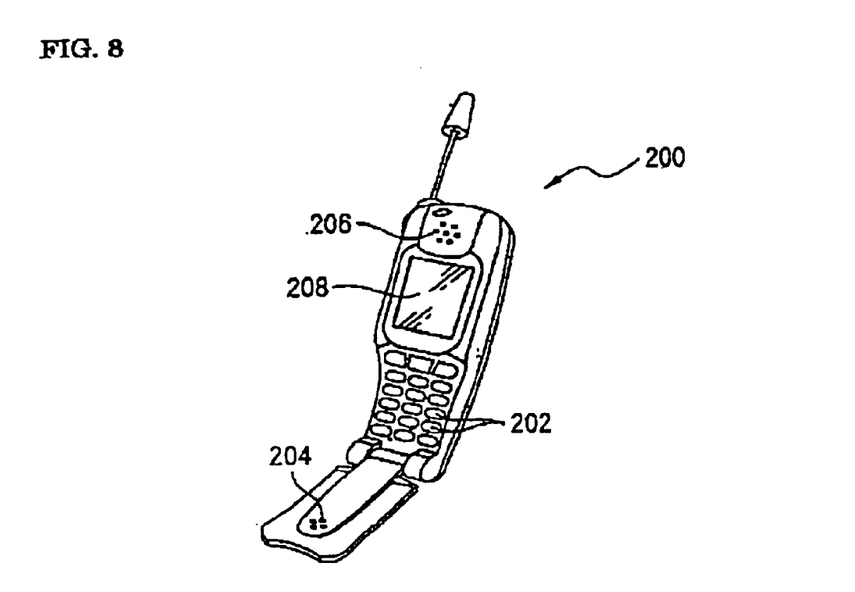
FIG. 8 is a perspective view showing the structure of a mobile phone corresponding to an example of an electronic apparatus to which the organic EL device of the present invention is applied.

FIG. 8 is a perspective view of a mobile phone. In FIG. 8, a mobile phone 200 comprises, in addition to a plurality of operation buttons 202, an ear piece 206, a mouthpiece 204, and a display panel 208 formed of the organic EL device of the present invention.

Figure 9:
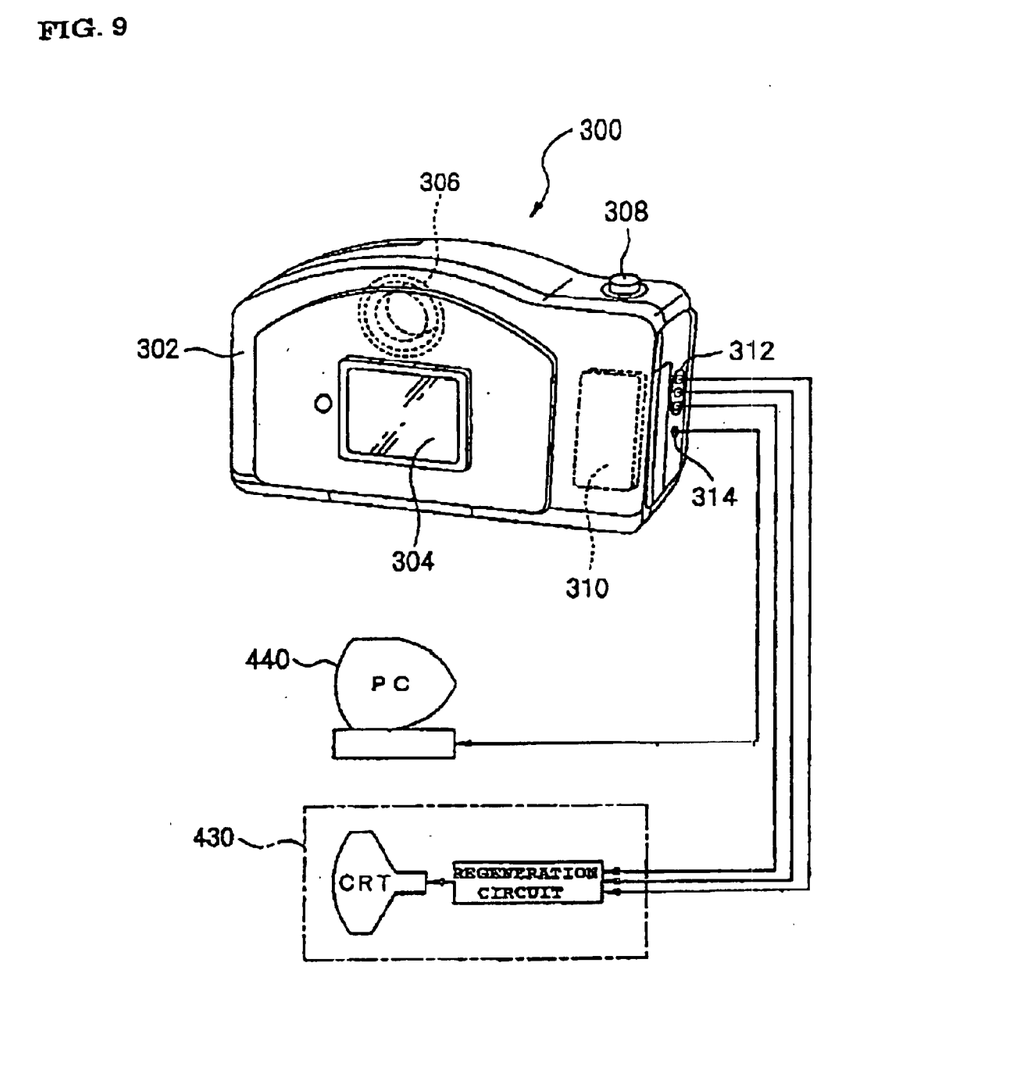
FIG. 9 is a perspective view showing the structure of a digital still camera corresponding to an example of an electronic apparatus to which the organic EL device of the present invention is applied.

FIG. 9 is a perspective view showing the structure of a digital still camera 300. In the figure, the connection with external apparatuses is also briefly shown. Compared to a typical camera which exposes a film to an optical image of an object, the digital camera 300 produces image signals by performing photoelectric conversion of an optical image of an object using an imaging element such as a CCD (Charged Coupled Device).

A display panel 304 composed of the organic EL device of the present invention is provided on the back surface of a case 302 of the digital still camera 300, and the structure is formed so as to perform display in accordance with the image signals provided from the CCD. Accordingly, the display panel 304 serves as a viewfinder for displaying the object. In addition, a light-receiving unit 306 containing an optical lens, and the CCD, for example, is provided on an observing side (the back surface side in the figure) of 302.

When a picture taker views an object image displayed on the display panel 304 and then presses a button 308, an image signal of the CCD at that time is transferred to and stored in a memory of a circuit substrate 310. In addition, in this digital still camera 300, a video signal output terminal 312 and an input/output terminal 314 for data communication are provided on the side surface of the case 302.

In addition, as shown in the figure, as required, a television monitor 430 and a personal computer 440 are connected to the video signal output terminal 312 and the input/output terminal 314 for data communication, respectively. Furthermore, the structure is formed so that the image signal stored in the memory of the circuit substrate 310 is output on the television monitor 430 or to the personal computer 440 by a predetermined operation.

As an electronic apparatus to which the organic EL device of the present invention can be applied as a display unit, in addition to the personal computer in FIG. 7, the mobile phone in FIG. 8, and the digital still camera in FIG. 9, there may be mentioned a television, a viewfinder type and a direct viewing video tape recorder, a car navigation apparatus, a pager, an electronic notebook, an electronic calculator, a word processor, a workstation, a television phone, a point of sales (POS) terminal, and an apparatus provided with a touch panel.

As has thus been described, according to the present invention, since the organic EL device is formed without forming banks (banks surrounding the areas at which the light-emitting layers are formed) which have been conventionally required to be formed, the production cost can be reduced. In particular, the insulating properties in the non light-emitting area can reliably be obtained.

What is claimed is:

1. An organic EL device, comprising:
   a plurality of light-emitting areas above a substrate, each of the light-emitting areas having a light-emitting layer and a hole injection/transport layer provided between a first electrode layer and a second electrode layer opposing thereto;
   a plurality of non-light-emitting areas above the substrate, each of the non light-emitting areas having a non light-emitting layer provided between the plurality of light-emitting areas;
   a fluorine containing layer is formed between the hole injection/transport layer and the light-emitting layer; and
   a hole blocking layer, which allows electrons but not holes to pass therethrough, over the light-emitting layers and non light-emitting layers to enhance insulating properties between the plurality of light-emitting areas.

2. The organic EL device according to claim 1, further comprising a layer composed of a material containing fluorine between the first electrode layer and the light-emitting layer.

3. The organic EL device according to claim 1, wherein the first electrode layer is an anode and the second electrode layer is a cathode, further wherein the anode is provided with the hole injection/transport layer thereon, and the hole blocking layer comprises at least one of an alkali fluoride and an alkali earth fluoride.

4. An electronic apparatus having an organic EL device, the organic EL device comprising:
   a plurality of light-emitting areas above a substrate, each of the light-emitting areas having a light-emitting layer provided between a first electrode layer and a second electrode layer opposing thereto;
   a plurality of non light-emitting areas above the substrate, each of the non light-emitting areas having a non light-emitting layer and a hole injector/transport layer provided between the plurality of light-emitting areas;
   a fluorine containing layer is formed between the hole injection/transport layer and the light-emitting layer; and
   the hole injection/transport layer and a hole blocking layer, which allows electrons but not holes to pass therethrough, in both of the light-emitting areas and the non light-emitting areas.

5. The electronic apparatus having an organic EL device of claim 4, wherein the first electrode is an anode and the second electrode is a cathode.

6. The electronic apparatus having an organic EL device of claim 5, wherein, the hole injection/transport layer is formed between the first electrode and the light-emitting layer.

7. The electronic apparatus having an organic EL device of claim 4, wherein the hole blocking layer is formed over the light-emitting layer.

8. The electronic apparatus having an organic EL device of claim 4, wherein the hole blocking layer is formed between the cathode and the light-emitting layer.

9. The organic EL device of claim 1, wherein the first electrode is an anode and the second electrode is a cathode.

10. The organic EL device of claim 1, wherein the hole blocking layer is formed over the light-emitting layer.

11. The organic EL device of claim 1, wherein the hole blocking layer is formed between the cathode and the light-emitting layer.

12. An organic EL device, comprising:
    a light-emitting layer and a hole injection/transport layer provided between a first electrode layer and a second electrode layer opposing thereto, and
    a fluorine containing layer formed between the hole injection/transport layer and the light-emitting layer.

13. The organic EL device to claim 12, the light-emitting layer being formed by an ink-jet method.

* * * * *